(12) United States Patent
Javidi et al.

(10) Patent No.: US 8,696,811 B2
(45) Date of Patent: Apr. 15, 2014

(54) METHOD FOR FEEDING ARSENIC DOPANT INTO A SILICON CRYSTAL GROWING APPARATUS

(75) Inventors: Massoud Javidi, St. Peters, MO (US); Steve Garner, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 1163 days.

(21) Appl. No.: 12/625,931

(22) Filed: Nov. 25, 2009

(65) Prior Publication Data

US 2010/0132829 A1    Jun. 3, 2010

Related U.S. Application Data

(62) Division of application No. 12/108,923, filed on Apr. 24, 2008, now Pat. No. 7,922,817.

(51) Int. Cl.
*C30B 15/04* (2006.01)

(52) U.S. Cl.
USPC ............ 117/33; 117/11; 117/13; 117/18; 117/19; 117/30

(58) Field of Classification Search
USPC .............. 117/11, 13, 18, 19, 30, 33
See application file for complete search history.

(56) References Cited

U.S. PATENT DOCUMENTS

| | | | |
|---|---|---|---|
| 5,408,951 A * | 4/1995 | Tamida | 117/17 |
| 5,492,078 A | 2/1996 | Alterkruger | |
| 5,762,491 A * | 6/1998 | Williams et al. | 432/156 |
| 5,779,791 A | 7/1998 | Korb | |
| 5,900,055 A | 5/1999 | Nagai | |
| 5,902,395 A | 5/1999 | Nagai et al. | |
| 6,059,875 A | 5/2000 | Kirkland | |
| 6,059,876 A | 5/2000 | Yin | |
| 7,132,091 B2 | 11/2006 | Kulkarni | |
| 2003/0061985 A1 | 4/2003 | Kulkarni et al. | |
| 2003/0159647 A1 * | 8/2003 | Arvidson et al. | 117/30 |

FOREIGN PATENT DOCUMENTS

| | | |
|---|---|---|
| EP | 0635588 A1 | 1/1995 |
| EP | 0903429 A2 | 3/1999 |
| FR | 2038156 | 3/1970 |
| FR | 2325425 | 9/1976 |
| JP | 59156993 | 6/1984 |
| JP | 61163188 | 7/1986 |
| JP | 61227986 | 10/1986 |
| JP | 62153188 | 7/1987 |
| JP | 5201790 | 8/1993 |
| JP | 06271399 | 9/1994 |
| JP | 9227275 | 9/1997 |
| WO | 9736024 | 10/1997 |
| WO | 9935310 | 7/1999 |
| WO | 0186033 A1 | 11/2001 |

* cited by examiner

*Primary Examiner* — Matthew Song
(74) *Attorney, Agent, or Firm* — Armstrong Teasdale LLP

(57) ABSTRACT

A feed assembly and method of use thereof of the present invention is used for the addition of a high pressure dopant such as arsenic into a silicon melt for CZ growth of semiconductor silicon crystals. The feed assembly includes a vessel-and-valve assembly for holding dopant, and a feed tube assembly, attached to the vessel-and-valve assembly for delivering dopant to a silicon melt. An actuator is connected to the feed tube assembly and a receiving tube for advancing and retracting the feed tube assembly to and from the surface of the silicon melt. A brake assembly is attached to the actuator and the receiving tube for restricting movement of the feed tube assembly and locking the feed tube assembly at a selected position.

9 Claims, 6 Drawing Sheets

US 8,696,811 B2

METHOD FOR FEEDING ARSENIC DOPANT INTO A SILICON CRYSTAL GROWING APPARATUS

CROSS-REFERENCE TO RELATED APPLICATION

This application is a divisional of U.S. patent application Ser. No. 12/108,923, filed Apr. 24, 2008, now U.S. Pat. No. 7,922,817, and entitled, "METHOD AND APPARATUS FOR FEEDING ARSENIC DOPANT INTO A SILICON CRYSTAL GROWING APPARATUS", which is hereby incorporated by reference in its entirety.

BACKGROUND OF THE INVENTION

The present invention generally relates to the preparation of semiconductor grade silicon crystals, used in the manufacture of electronics. More particularly, the invention relates to a device for feeding arsenic dopant into an apparatus for producing low resistivity silicon crystals.

Silicon crystal growth using the Czochralski (CZ) method involves changing the characteristics and properties of the silicon ingot being grown by adding a dopant material to the molten silicon before silicon ingot growth. A common dopant material used in this process is arsenic. Arsenic, however, is a volatile substance and problems often arise through conventional methods of introducing the dopant to the silicon melt.

One such method is to dump the dopant from a port positioned above the melt. However, because of the high temperatures of the process, there is a violent loss of arsenic to the argon gas environment above the melt. This results in the generation of oxide-particles which can prolong and compromise the crystal growing process. Thus, this method is very inefficient.

Another method uses a quartz vessel containing the dopant above the melt for introducing the volatile gas to the melt. This method can reduce loss of vaporized dopant if the vessel has a port extending into the melt. Regardless, these methods result in complicated operation and loss of volatile dopant. The present invention overcomes these difficulties and disadvantages associated with prior art processes by introducing the dopant to the melt at an upper surface of the melt.

SUMMARY OF THE INVENTION

In one aspect, the present invention includes a feed assembly for feeding a dopant to a silicon melt in a crystal growing apparatus. The assembly comprises a vessel for holding and releasing a dopant solid material and an elongate feed tube operatively connected to the vessel. The feed tube comprises a fixed tube and a movable tube concentrically arranged with the fixed tube. The assembly also includes an actuator connected to the moveable tube for moving the moveable tube relative to the fixed tube for advancing the moveable tube toward an upper surface of the silicon melt in the apparatus and retracting the moveable tube away from the upper surface of the silicon melt to selectively position the moveable tube for introducing the dopant material released from the vessel to the silicon melt when the feed assembly is mounted on the crystal growing apparatus.

In another aspect, the present invention includes a method for feeding arsenic dopant to a silicon melt in a silicon crystal growing apparatus having a crystal growing chamber. The method includes placing granular solid arsenic dopant in a vessel attached to a feed tube comprising a fixed tube and a movable tube in concentric arrangement. The moveable tube is lowered toward the silicon melt with an actuator connected to the moveable tube to selectively position the moveable tube at the surface of the silicon melt. In addition, the dopant is released from the vessel to allow dopant to travel down the feed tube and into the melt at an upper surface of the melt.

In still another aspect, the present invention includes a method for feeding arsenic dopant to a silicon melt in a silicon crystal growing apparatus having a crystal growing chamber. The method comprises placing granular solid arsenic dopant in a vessel attached to a feed tube comprising a fixed tube and a moveable quartz tube having an angled tip. The fixed tube and moveable quartz tube are in concentric arrangement. Further, the method includes lowering the moveable tube toward the silicon melt with an actuator connected to the moveable tube to selectively position the moveable tube at the surface of the silicon melt. Still further, the method comprises releasing the dopant from the vessel to allow the dopant to travel down the feed tube to a catch located in the moveable tube for catching the dopant material when it is released from the vessel. In addition, the method comprises introducing argon gas into the feed tube below the vessel causing sublimation of the dopant resulting in dopant laden argon exiting the angled tip of the moveable quartz tube at an upper surface of the silicon melt.

In yet another aspect, the present invention includes a feed assembly for feeding a dopant to a silicon melt in a crystal growing apparatus. The feed assembly comprises a vessel for holding and releasing a dopant solid material and an elongate feed tube attached to the vessel. The feed tube includes a fixed tube and a movable tube concentrically arranged with the fixed tube. Further, the feed assembly includes a catch located within the moveable tube for catching the dopant material when it is released from the vessel.

Other objects and features will be in part apparent and in part pointed out hereinafter.

BRIEF DESCRIPTION OF THE DRAWINGS

Corresponding reference characters indicate corresponding parts throughout the drawings.

DESCRIPTION OF THE PREFERRED EMBODIMENTS

Figure 1:
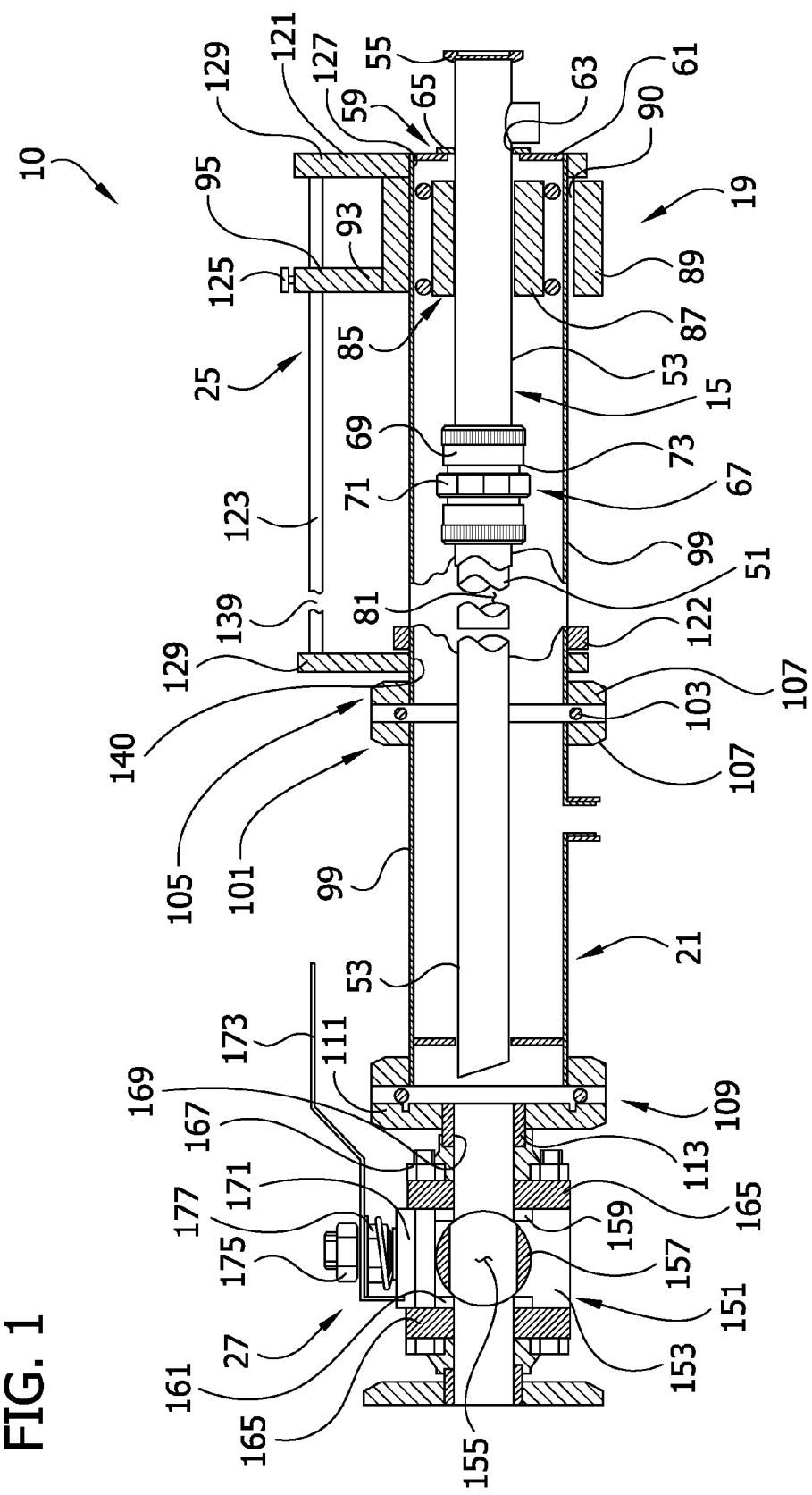
FIG. 1 is a cross section of a first embodiment of a feed assembly in a retracted position.

Multiple embodiments for an arsenic dopant feed assembly are illustrated. FIG. 1 illustrates a first embodiment of an arsenic dopant feed assembly, generally designated by the reference number 10. In the first embodiment, the dopant feed assembly 10 is fabricated from a refractory material that is non-contaminating and non-reactive with arsenic, silicon and graphite.

The first embodiment of the feed assembly 10 comprises a vessel-and-valve assembly 11 for holding dopant solid (not shown), and a feed tube assembly, generally indicated at 15, attached to the vessel-and-valve assembly 11 for delivering the dopant to a silicon melt (not shown). An actuator 19 is operatively connected between the feed tube assembly 15 and a receiving tube 21 for advancing and retracting the feed tube assembly to and from an upper surface of the silicon melt. A brake assembly 25 is operatively connected between the actuator 19 and the receiving tube 21 for restricting movement of the feed tube assembly 15 and locking the feed tube assembly at a selected position. An isolation valve 27 is provided at a bottom of the feed tube assembly 15. The valve 27 is configured for placing the feed assembly 10 in communication with a crystal growing apparatus 31 (see FIG. 6).

Figure 2:
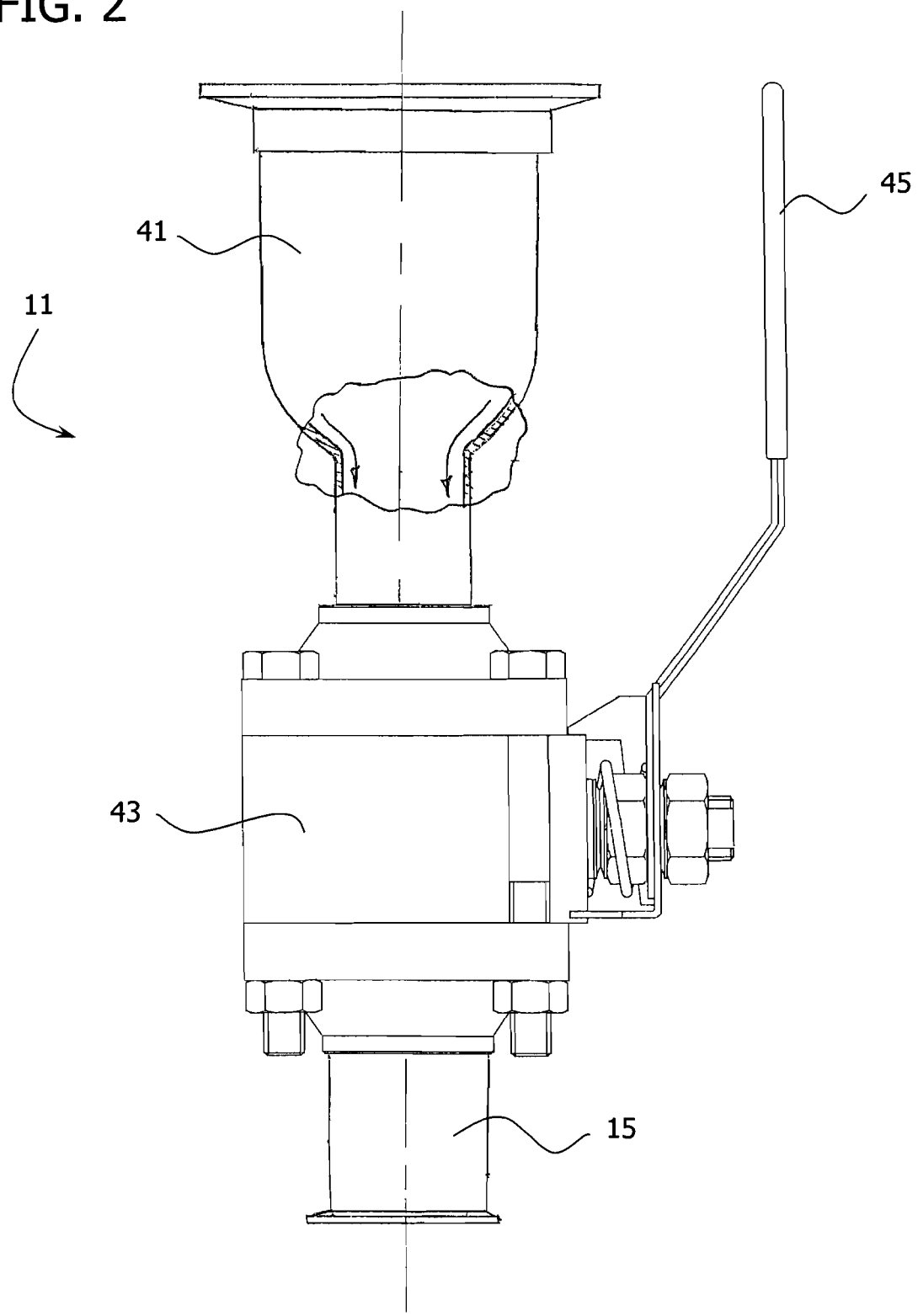
FIG. 2 is a front view of a vessel-and-valve assembly of the feed assembly with a portion broken away showing the flow of dopant material.

Referring to FIG. 2, the vessel-and-valve assembly 11 includes a dopant cartridge 41 configured for holding the dopant solid and a valve 43 attached to the feed tube assembly 15 that can be opened to release the dopant down the feed tube assembly. The valve 43 has a handle 45 for opening and closing the valve.

The feed tube assembly 15 comprises a series of elongate concentric tubes including a fixed tube 51 and one or more moveable tubes 53 situated around the fixed tube and arranged in a telescoping fashion (see FIG. 1). The fixed tube 51 is closed at a first end 54 by a vacuum flange 55 and is received by the moveable tubes 53 at a second end 57 (see FIG. 3). An end cap 59 at the first end 54 attaches the fixed tube 51 to the receiving tube 21. The end cap 59 includes a seat 61 having an opening 63 which receives the first end 54 of the fixed tube 51. An annular seal 65 seals the opening 63 between the end cap 59 and the fixed tube 51.

A vacuum fitting 67 connects each moveable tube 53 to an adjacent moveable tube. Each vacuum fitting 67 includes two opposing ring fittings 69 connected to each other by a threaded coupling 71 engaging threads 73 on the ring fittings. The embodiment illustrated in FIG. 1 shows two moveable tubes, however a single moveable tube or three or more moveable tubes are contemplated as being within the scope of the present invention.

The feed tube assembly 15 provides a passage 81 through which dopant material travels when it is released from the vessel-and-valve assembly 11. An outlet 83 of the moveable tubes 53 is in fluid communication with the vessel-and-valve assembly 11 for introducing the dopant to the silicon melt (see FIG. 3). In this first embodiment, the feed tube assembly 15 can be made of any refractory material that is non-contaminating and non-reactive with arsenic, silicon and graphite. As will be explained in greater detail later, a moveable tube 53' of the second embodiment that is positioned at the surface of the melt is fabricated from quartz.

Referring to FIG. 1 the actuator 19 comprises a linear translator 85 including an annular magnetic sleeve 87 attached to the moveable tubes 53 and an annular magnetic slide 89 adjacent and magnetically coupled to the sleeve. The magnetic sleeve 87 is sized and shaped for receiving the moveable tubes 53 in the sleeve. The sleeve 87 is secured to the moveable tubes 53 by friction fitting. The magnetic slide 89 is sized and shaped for receiving the receiving tube 21 and directly engages the outer surface of the receiving tube 21. A small clearance 90 between the receiving tube 21 and the magnetic slide 89 allows the magnetic slide to slide along the length of the receiving tube. The slide 89 is aligned with the magnetic sleeve 87, creating a magnetic coupling due to the opposite polarization of the two structures. This coupling secures the slide 89 to the receiving tube 21 at the same height that the magnetic sleeve 87 is positioned on the moveable tubes 53. As a result, movement of the slide 89 along the receiving tube 21 causes the magnetic sleeve 87 to move under the force of magnetic attraction. As the slide 89 moves up and down the receiving tube 21, the moveable tubes 53 slide away from and toward the fixed tube 51 for positioning a tip 91 of the moveable tubes 53 at the surface of the silicon melt (see FIG. 3). As will be explained in greater detail below, the magnetic slide 89 also includes an extension 93 having an annular teardrop shape with an aperture 95 at its tapered end. The aperture 95 is configured for attaching to the brake assembly 25. Although the preferred embodiment of the invention incorporates the magnetically coupled linear translator, it is envisioned that other suitable actuators (e.g., mechanical, electrical, or electromechanical) could be used without departing from the scope of this invention.

Figure 4:
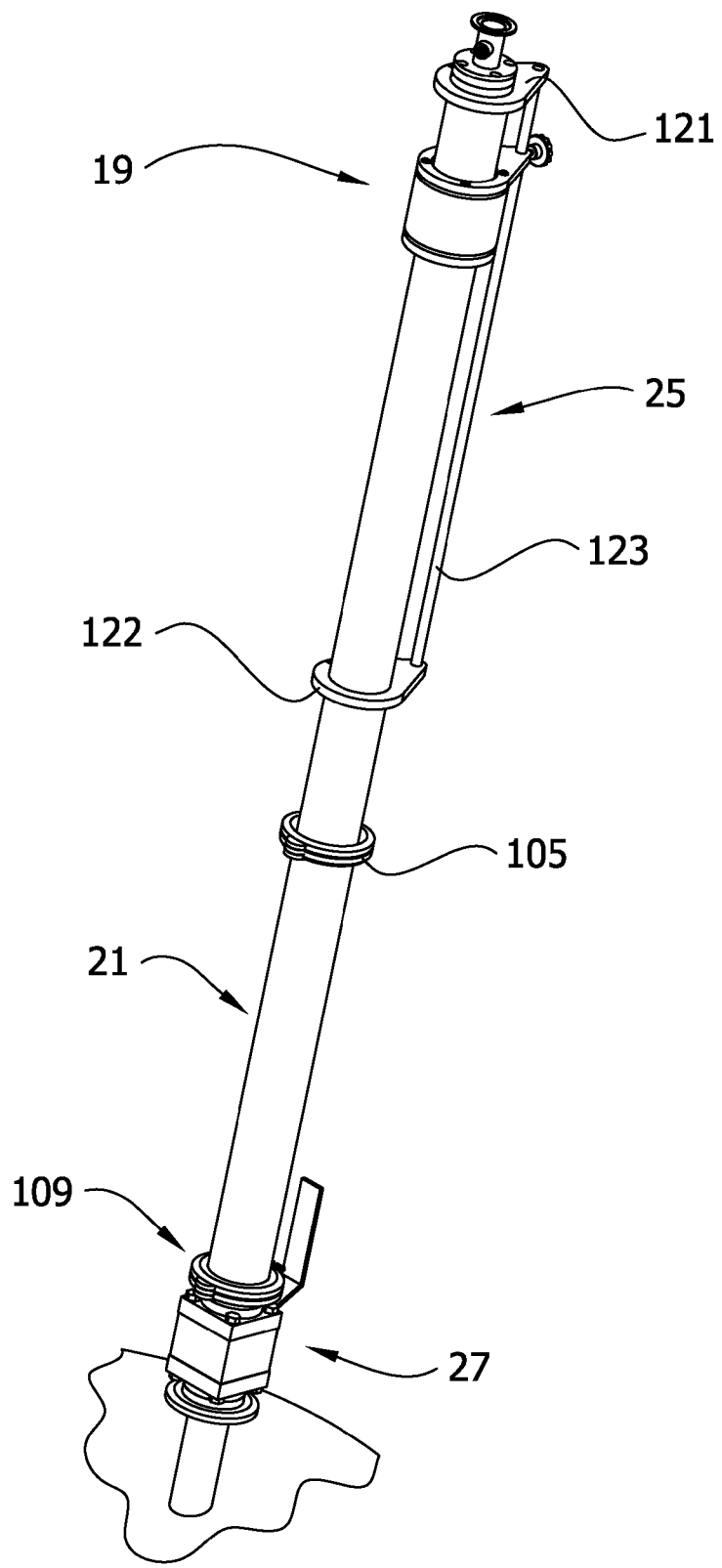
FIG. 4 is a perspective of the feed assembly attached to a crystal grower furnace chamber.

Referring to FIG. 4, the receiving tube 21 is an elongate tube made of stainless steel. The receiving tube 21 separates a portion of the actuator 19 and feed tube assembly 15 from the surrounding environment (see FIG. 1). The feed assembly 10 is illustrated as having two receiving tube members 99 connected in series. However, any number of receiving tube members 99 is foreseen. A first seal assembly 101 connects the receiving tubes 21. The seal assembly 101 comprises an o-ring 103 and a clamp 105 having semi-circular clamp halves 107. A second seal assembly 109 connects the receiving tube 21 to the isolation valve 27. One clamp half 111 of the second seal assembly 109 has a threaded extension 113 for connecting the receiving tube 21 to the isolation valve 27 as will be explained in greater detail below.

Figure 5:
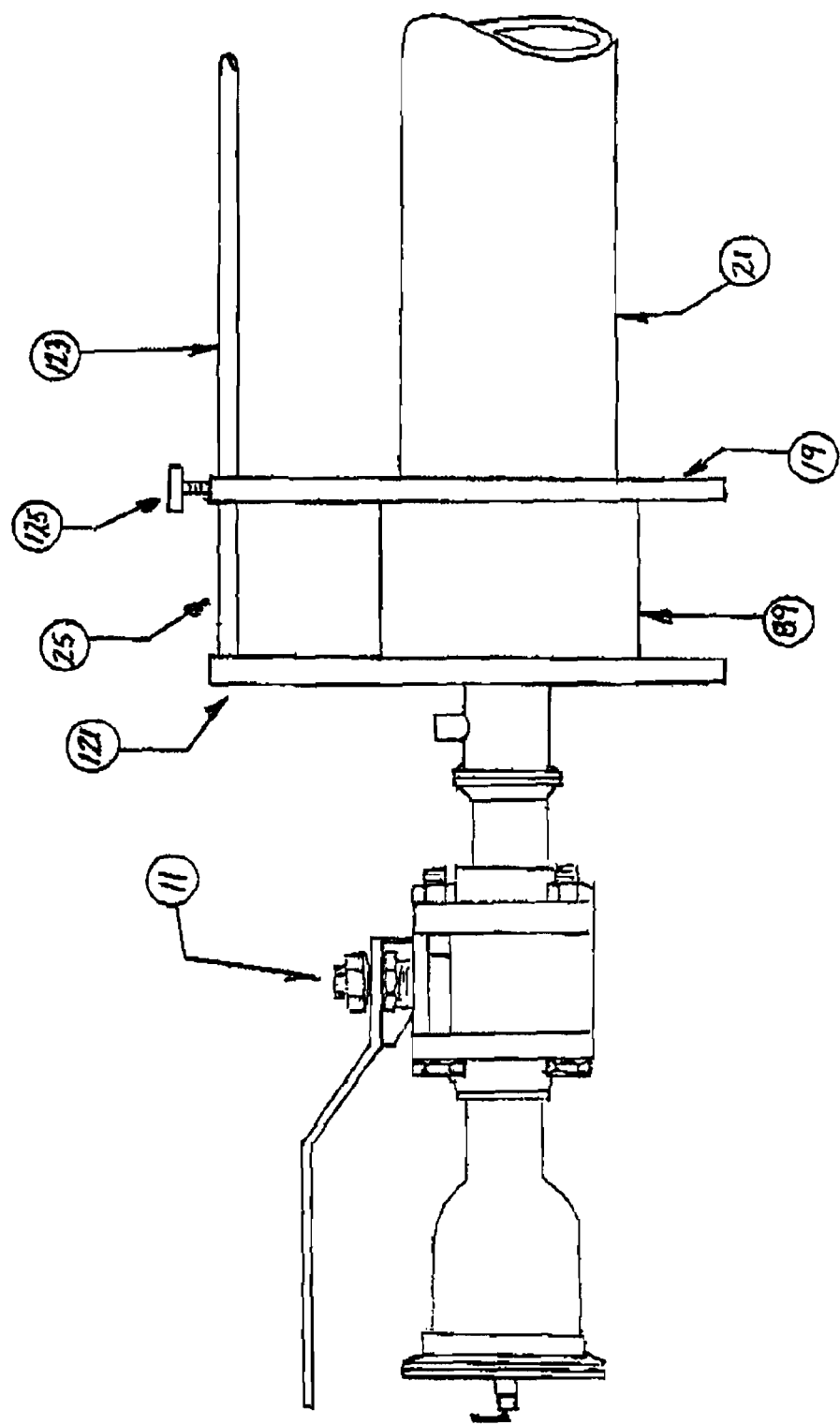
FIG. 5 is a perspective of the vessel-and-valve assembly and actuator of the feed assembly.

Referring to FIGS. 1 and 5, the brake assembly 25 comprises stops 121, 122 positioned on the receiving tube 21, a rod 123 (broadly, a "braking member") disposed between the stops and a screw 125 (broadly, a locking member) engaging the braking member and the magnetic slide 89 for locking the slide at a selected position along the receiving tube 21. Similar to the extension 93 on the magnetic slide 89, the stops 121, 122 have an annular teardrop shape with a central opening 127 at its bulbous end for receiving the receiving tube 21 and a hole 129 at the tapered end extending from a top face 131 to a bottom face 133 for receiving the braking member 123. A side face 135 on the tapered end has an adjustment opening 137. The stops 121, 122 are positioned on the receiving tube 21 above and below the magnetic slide 89. The braking member 123 passes through the hole 129 in the first stop 121, the aperture 95 in the slide 89 and the hole 129 in the second stop 122. Thus, the braking member 123 links the stops 121, 122 to the slide 89 creating a track 139 to guide the slide along the receiving tube 21.

The stops 121, 122 are also adjustable. The central opening 127 is sized and shaped for receiving the receiving tube 21. Similar to the magnetic slide 89, a small clearance 140 between the stops 121, 122 and the receiving tube 21 allow the stops to slide along the length of the receiving tube. On the receiving tube 21 the stops 121, 122 can be slid to a selected position. Once the selected position for the stops 121, 122 is achieved, a stop screw 141 can be inserted into the adjustment bore 137 to lock the stops in place. The tip of the stop screw 141 presses against the braking member 123 holding the stops 121, 122 in position. The stop screw 141 can then be unscrewed to allow the stops 121, 122 to move to another position on the receiving tube 21 and re-tightened to lock the stops in place again.

Figure 6:
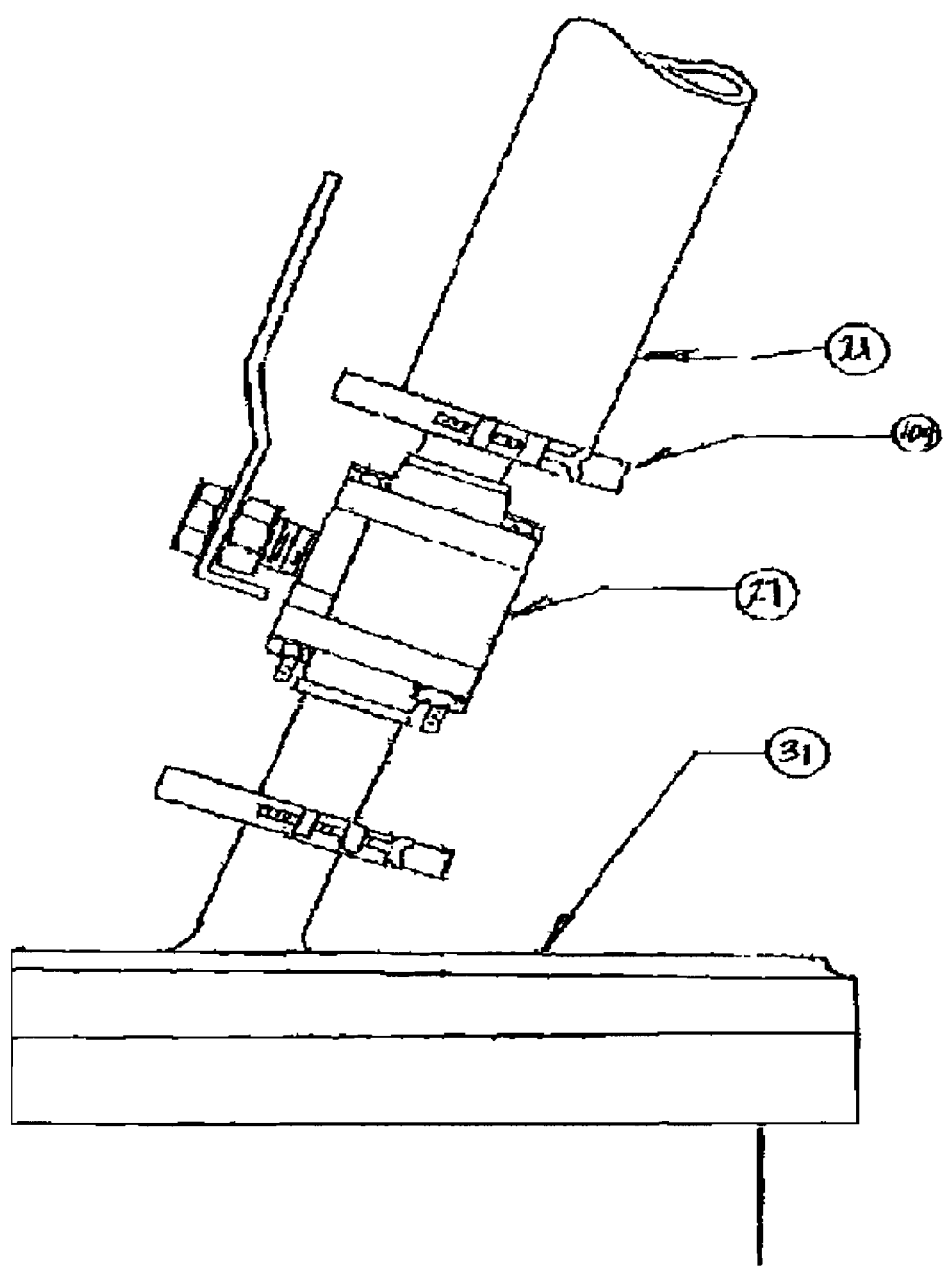
FIG. 6 is a perspective of an isolation valve of the feed assembly attached to the crystal grower.

Referring to FIGS. 1 and 6, in one embodiment the isolation valve 27 comprises a ball valve 151 having a body 153 and a passageway 155 with a ball 157 disposed in the passageway mounted for selective rotation between open and closed positions (illustrated embodiment shown in open position. A pair of valve seats 159, 161 are provided in the passageway 155 on opposing sides of the ball 157. In the preferred embodiment, the valve seats 159, 161 are located substantially equidistant from an axis of rotation of the ball 157 and include radial openings 163. The ball 157 and valve seats 159, 161 are enclosed within the body 153 by a pair of end fittings 165. The end fittings 165 can be mounted to the body 153 by any sufficient means. In the present invention, mounting bolts 167 are utilized. At least one end fitting 165 is also provided with internal threads 169 to facilitate connecting the isolation valve 27 to the feed tube assembly 15 by the threaded extension 113 on the second seal assembly 109. It is understood that any other convenient means of connecting the isolation valve to the feed tube assembly is within the scope of the present invention.

A stem assembly 171 and handle 173 are provided for actuating the isolation valve 27. The handle 173 is releasably secured to the stem assembly 171 by a nut 175 that clamps to the tip of a packing nut 177 and also helps to support the ball 157 in the body 153. The ball 157 is supported in the passageway 155 such that the ball can shift axially along the passageway. The ball valve 151 can be manually actuated with the handle 173, or an actuator (not shown) may be provided to actuate the valve. The positions of the handle 173 and the ball 157 are limited by a depending catch member 179 carried by the handle. The catch member 179 engages a surface of the body 153 to provide fixed stops for the isolation valve 27.

The structure of the isolation valve as described above reflects a preferred embodiment. It will be readily apparent to those skilled in the art that changes and additions to the structure may be made to accommodate specific operational requirements. Such modifications are not deemed to affect the scope of the present invention.

Operation of this first embodiment of the feed assembly 10 is as follows. Once the silicon melting process is complete, the actuator 19 advances the moveable tubes 53 of the feed tube assembly 15 so the outlet 83 of the moveable tubes 53 is located at the upper surface of the silicon melt. The locking member 125 of the brake assembly 25 is tightened to lock the magnetic slide 89 in place, thus locking the outlet 83 of the moveable tubes 53 in position at the surface of the silicon melt. The dopant held in the vessel-and-valve assembly 11 is released when the valve 43 in the dopant cartridge 41 is opened. The dopant will travel through the feed tube assembly 15, past an opened isolation valve 27 and into the silicon melt at the surface of the melt. The moveable tubes 53 are retracted by the actuator 19 and argon gas is released below the vessel-and-valve assembly 11 into the feed tube assembly 15 for cooling the assembly 10. Finally, the assembly 10 is isolated from the crystal growing apparatus 31 by closing the isolation valve 27.

Figure 3:
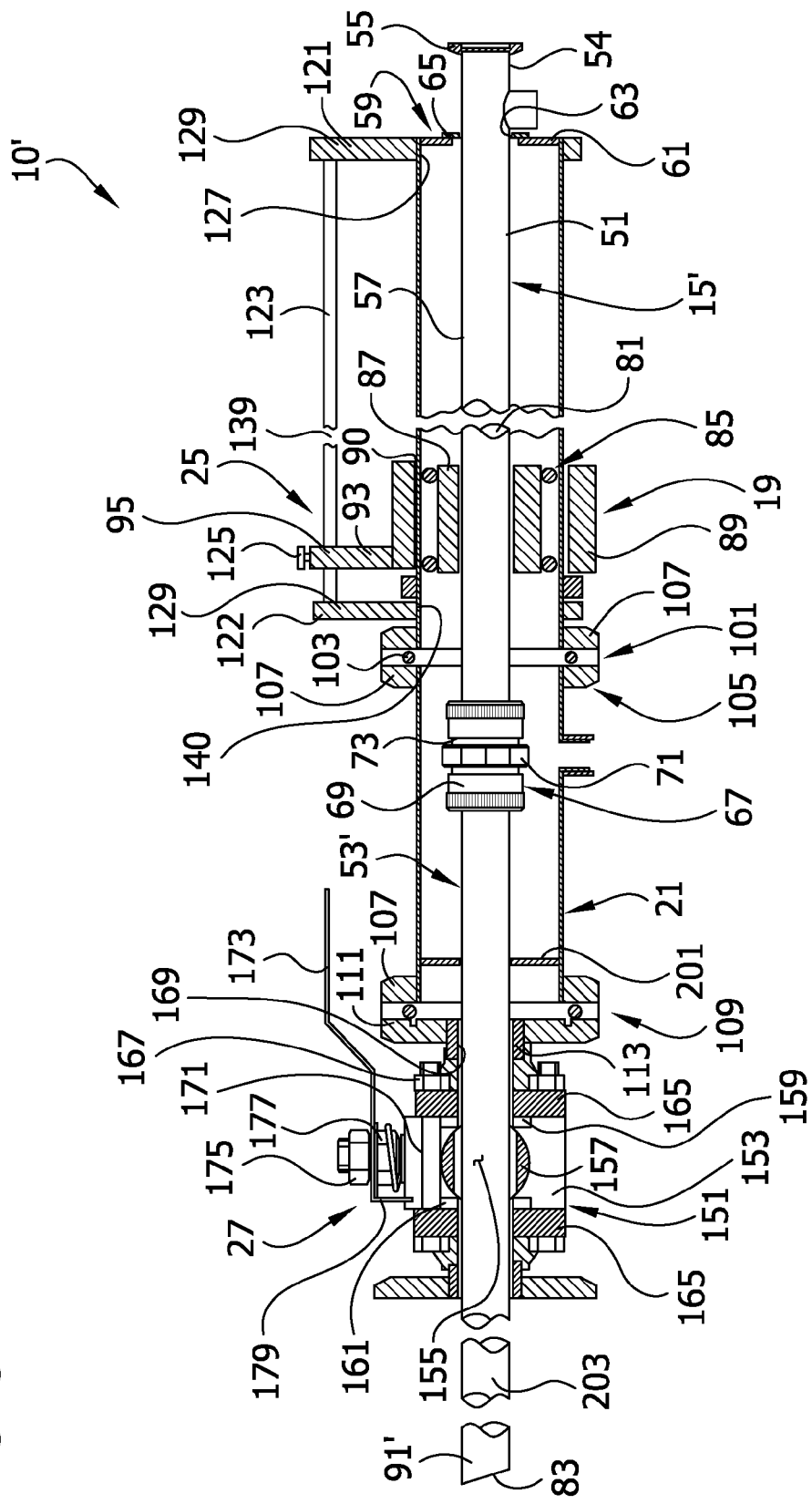
FIG. 3 is a cross section of a second embodiment of the feed assembly in an extended position.

As illustrated in FIG. 3, a second embodiment of the feed assembly 10' is designated in its entirety by the reference number 10'. The components of the second embodiment are exactly the same as the first embodiment except for a modified feeding tube assembly 15'. The feeding tube assembly 15' of the second embodiment comprises a moveable tube 53' made of a special quartz material. This material is used primarily to accommodate gas phase doping. The quartz tube 53' is a thick walled clear fused quartz tube with an outside diameter of about 25 mm, a wall thickness of about 3 mm and a length of about 711 mm. This tube 53' has an angled tip 91' allowing a maximum melt surface area to be exposed to dopant gasses flowing from the tip. Additionally, the moveable tube 53' includes a guide 201 aligning the quartz tube 53' and a perforated disk 203 preventing the dopant from exiting the tube 53' into the silicon melt 17. When the dopant material trapped in the tube 53', argon gas can be introduced into the feed tube assembly 15' causing the dopant laden argon to travel down the feed tube assembly 15' under sublimation and exit the angled tip 91' at the upper surface of the silicon melt.

This second embodiment of the feed assembly 10' operates as follows. The process is similar to the process described for the first embodiment except the actuator 19 advances the quartz tube 53' of the feed tube assembly 15' so the angled tip 91' is positioned at the upper surface of the silicon melt. The locking member 125 of the brake assembly 25 is tightened to lock the magnetic slide 89 in position, thus locking the angled tip 91' of moveable tubes 53' in position at the upper surface of the silicon melt. The dopant held in the vessel-and-valve assembly 11 is released when the valve 43 in the dopant cartridge 41 is opened by the handle 45. The dopant travels through the feed tube assembly 15' and is collected on the perforated internal disk 203. Argon gas is introduced into the feed tube assembly 15' below the vessel-and-valve assembly 11. Sublimation of the dopant will occur as the dopant is captured at the perforated disk 203. This process results in dopant laden argon traveling past the opened isolation valve 27 and out the angled tip 91' of the quartz tube 53' at the upper surface of the silicon melt. After the dopant has undergone sublimation, the quartz tube 53' is retracted by the actuator 19 and the feed tube assembly 15' is cooled with the flow of argon gas. Finally, the assembly 10' is isolated from the crystal growing apparatus 31 by closing the isolation valve 27.

Having described the invention in detail, it will be apparent that modifications and variations are possible without departing from the scope of the invention defined in the appended claims.

When introducing elements of the present invention or the preferred embodiments(s) thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method for feeding arsenic dopant to a silicon melt in a silicon crystal growing apparatus having a crystal growing chamber comprising the steps of:
    placing granular solid arsenic dopant in a vessel attached to a feed tube, the feed tube comprising a fixed tube and a movable tube in concentric arrangement;
    lowering the moveable tube toward the silicon melt with an actuator connected to the moveable tube to selectively position the moveable tube at the upper surface of the silicon melt, the actuator comprising a linear translator magnetically coupled to the moveable tube; and
    releasing the dopant from the vessel to allow dopant to travel down the feed tube and into the melt at the upper surface of the melt.

2. A method of claim 1 further comprising the steps of retracting the moveable tube with the actuator and cooling the feed tube by introducing argon gas into the feed tube.

3. A method of claim 2 further comprising the steps of isolating the feed tube from the growing apparatus with an isolation valve.

4. A method of claim 1 wherein a brake assembly attached to the moveable tube holds the moveable tube in a selected position for introducing the dopant material at the upper surface of the silicon melt.

5. A method for feeding arsenic dopant to a silicon melt in a silicon crystal growing apparatus having a crystal growing chamber, comprising the steps of:
    placing granular solid arsenic dopant in a vessel attached to a feed tube comprising a fixed tube and a moveable quartz tube having an angled tip, the fixed tube and moveable quartz tube being in concentric arrangement;
    lowering the moveable tube toward the silicon melt with an actuator connected to the moveable tube to selectively position the moveable tube at an upper surface of the silicon melt;
    releasing the dopant from the vessel to allow the dopant to travel down the feed tube to a catch located in the moveable tube for catching the dopant material when it is released from the vessel; and
    introducing argon gas into the feed tube below the vessel causing sublimation of the dopant resulting in dopant laden argon exiting the angled tip of the moveable quartz tube at the upper surface of the silicon melt.

6. A method of claim 5 further comprising the steps of:
    retracting the moveable tube with the actuator; and
    cooling the feed tube with argon gas.

7. A method of claim 6 further comprising the steps of isolating the feed tube from the growing apparatus with an isolation valve.

8. A method of claim 5 wherein the moveable tube is lowered by a linear translator magnetically coupled to the moveable tube.

9. A method of claim 8 wherein a brake assembly attached to the moveable tube holds the moveable tube in a selected position for introducing the dopant material at the upper surface of the silicon melt.

* * * * *